(12) United States Patent
Senthinathan et al.

(10) Patent No.: US 7,319,358 B2
(45) Date of Patent: Jan. 15, 2008

(54) METHOD AND APPARATUS FOR GENERATING AN ADAPTIVE POWER SUPPLY VOLTAGE

(75) Inventors: Ramesh Senthinathan, Richmond Hill (CA); Nancy Chan, Richmond Hill (CA)

(73) Assignee: ATI Technologies Inc., Markham, Ontario (CA)

( * ) Notice: Subject to any disclaimer, the term of this patent is extended or adjusted under 35 U.S.C. 154(b) by 19 days.

(21) Appl. No.: 11/306,475

(22) Filed: Dec. 29, 2005

(65) Prior Publication Data

US 2007/0152734 A1   Jul. 5, 2007

(51) Int. Cl.
*G05F 1/10* (2006.01)
(52) U.S. Cl. .................... 327/538; 327/530
(58) Field of Classification Search ............ 327/530, 327/538, 540–543, 147, 156; 331/1 R, 10, 331/17, 185
See application file for complete search history.

(56) References Cited

U.S. PATENT DOCUMENTS

| | | | | |
|---|---|---|---|---|
| 5,889,429 A | * | 3/1999 | Kobayashi et al. | 327/540 |
| 6,141,583 A | * | 10/2000 | Pape et al. | 607/2 |
| 6,414,527 B1 | * | 7/2002 | Seno et al. | 327/158 |
| 6,448,751 B1 | * | 9/2002 | Becker | 323/284 |
| 6,809,606 B2 | * | 10/2004 | Wong et al. | 331/175 |
| 6,996,730 B2 | * | 2/2006 | Bonnett | 713/322 |
| 7,042,277 B2 | * | 5/2006 | Cranford et al. | 327/538 |
| 7,071,768 B2 | * | 7/2006 | Abe et al. | 327/540 |
| 7,075,276 B2 | * | 7/2006 | Morales | 323/246 |
| 7,084,612 B2 | * | 8/2006 | Zinn | 323/266 |
| 7,088,197 B2 | * | 8/2006 | Brosh et al. | 331/186 |

* cited by examiner

*Primary Examiner*—Kenneth B. Wells
*Assistant Examiner*—Thomas J. Hiltunen
(74) *Attorney, Agent, or Firm*—Vedder, Price, Kaufman & Kammholz, P.C.

(57) ABSTRACT

In a method and apparatus for generating a power supply voltage, an integrated circuit including an adaptive power supply voltage circuit is provided where a target signal is generated representing an ideal or approximated ideal performance characteristic of a functional block operating with the power supply voltage. A generated functional block test signal is generated representing the performance characteristic of the functional block under these conditions. The adaptive power supply voltage circuit compares the target signal with the generated functional block test signal and adjusts the power supply voltage continuously until the target signal and generated functional block test signal are substantially equal. When the target signal and generated functional block test signal are substantially equal, the power supply voltage is locked for subsequent use. By optimizing the power supply voltage, minimal power dissipation is provided.

20 Claims, 6 Drawing Sheets

METHOD AND APPARATUS FOR GENERATING AN ADAPTIVE POWER SUPPLY VOLTAGE

FIELD OF THE INVENTION

The invention generally relates to generating power supply voltages, and, more specifically, generating adaptive power supply voltages

BACKGROUND OF THE INVENTION

Invented in 1959, the integrated circuit ("IC") is one of the workhorses behind many of the technological devices enjoyed throughout the world. In general, the concept behind the IC is one of miniaturization and reliability. The result of integration allows thousands of circuit components to be included on a single piece of semiconductor. In general, the complexity of ICs has grown exponentially since their creation more than four decades ago. In fact, engineers continue to make advancements that approximately double the number of components included in each IC every 18-24 months.

While these developments have fostered the electronic industry and allowed for smaller and faster devices, the miniaturization process and overall complexity of system design have at least one disadvantage over less complex systems of the past: power management. As systems incorporate multiple ICs each having multiple components, process corners, voltage corners and temperature corners can vary. Accordingly, prior art systems guarantee performance for systems incorporating at least one low corner IC by establishing a fixed, over-compensated power supply voltage for the system. By doing so, active and passive power dissipation is increased.

Mobile devices in particular are particularly hurt by these architectures. Because mobile devices, by definition, run on a limited amount of power, battery life and consumption are important concerns. While increased power supply voltage provides better overall performance, it also provides increased levels of active and standby power dissipation thus draining battery life. Accordingly, mobile devices are unable to sustain themselves over long periods of time without battery replacement or changed circumstances (e.g., recharging). Although battery life, per se, is not a concern for stationary/non-mobile systems, these devices would similarly benefit from operating conditions using an optimal power supply voltage to decrease active and standby power dissipation. For instance, such systems could provide more functionality by incorporating more features while using minimal power consumption.

Accordingly, a need exists for the generation of a power supply voltage optimized for a given frequency, thereby providing minimal active and standby power dissipation in a system comprising at least one IC.

BRIEF DESCRIPTION OF THE DRAWINGS

The invention will be more readily understood in view of the following description when accompanied by the below figures and wherein like reference numerals represent like elements.

DETAILED DESCRIPTION OF THE PRESENT EMBODIMENTS

Generally, the present disclosure provides a method and apparatus for generating a power supply voltage. An integrated circuit includes a target signal generating circuit that generates a target signal based on a power supply voltage and a signal comparator circuit that compares the target signal to a generated functional block test signal. The generated functional block test signal is generated from a functional block that receives a test pattern of data and the power supply voltage. The functional block may be any component or series of components that performs a logical function or operation. The generated functional block test signal represents a performance or operating characteristic of the functional block when supplied with the power supply voltage. The target signal represents an ideal or approximated ideal generated functional block test signal. A supply voltage adjustment circuit adjusts the power supply voltage as supplied to at least the functional block in response to the difference between the target signal and the generated functional block test signal.

While the present disclosure contemplates the adaptation of the above components in a single integrated circuit, it is contemplated that the described circuit components of the system may be incorporated in one or more integrated circuits. For example, one or more of the signal comparator circuit, the supply voltage adjustment circuit, the target signal generating circuit and the functional block may be part of the same or individual integrated circuits. Additionally, the present disclosure contemplates the adaptation of the above circuit components to a system on a chip containing multiple functional blocks and multiple voltage islands where any number of voltage islands requires an independent power supply voltage. Accordingly, multiple adaptive power supply circuits, each including at least a target signal generating circuit, a signal comparator circuit and a supply voltage adjustment circuit, are included in the system on a chip. Each adaptive power supply circuit produces an independent power supply voltage based on at least one test pattern of data. Thus, independent power supply voltages may be provided to any number of different voltage islands associated with the system on a chip.

Instead of over compensating the power supply voltage or voltages to guarantee performance across functional blocks with slow performance characteristics, the present disclosure provides optimized power supply voltage or voltages. Accordingly, minimal active and standby power dissipation is provided and battery power consumption in mobile devices is reduced. In a similar manner, non-mobile devices may provide additional features and operational capabilities while operating at minimal power supply levels.

Figure 1:
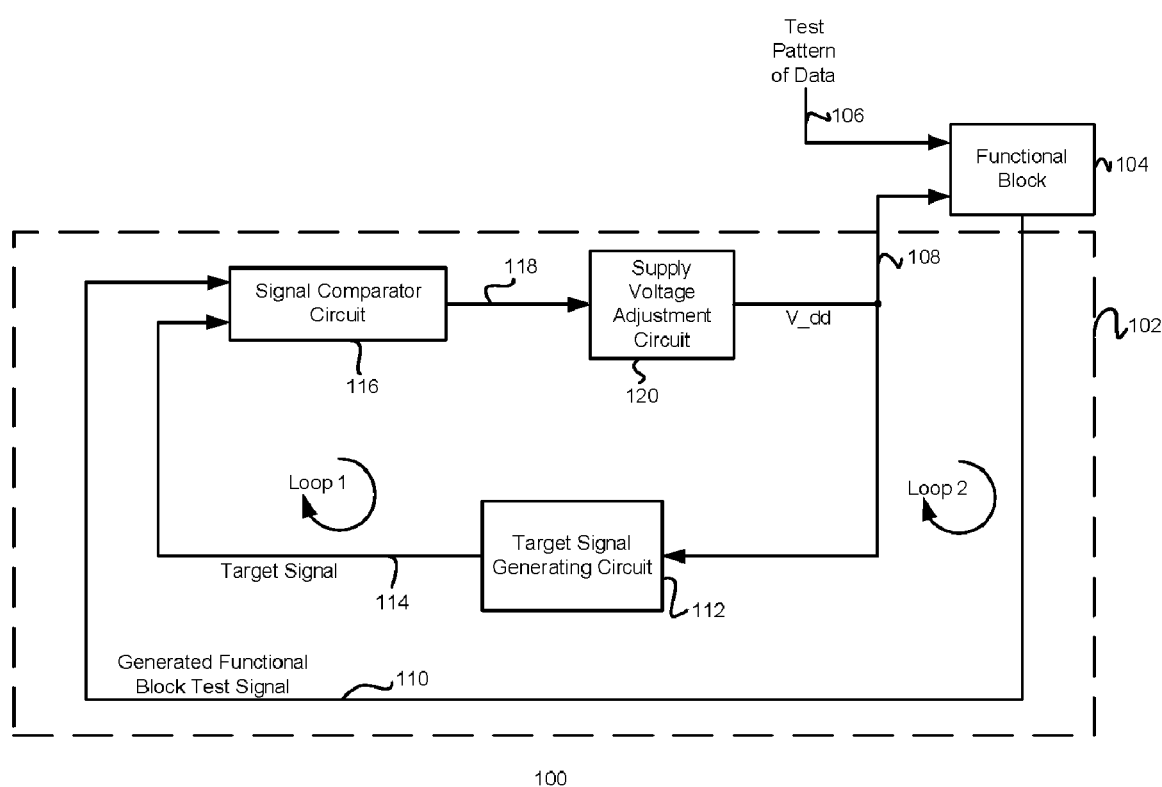
FIG. 1 is a block diagram illustrating one example of a portion of a system including an adaptive power supply circuit coupled to a functional block in accordance with one embodiment of the present disclosure.

Various embodiments of the present disclosure can be more fully described with reference to FIGS. 1 through 6. FIG. 1 is a block diagram of at least a portion of a system 100 including at least one IC where the at least a portion of the system 100 includes an adaptive power supply circuit 102 and a functional block 104. As previously defined, functional block 104 may be any portion of the system 100, regardless of its specific functionality, whereby at least one particular function is performed during normal operation. For example, functional block 104 may correspond to applicable electronic components or portions of a pipeline responsible for performing at least one logical function, such as but not limited to a processor, an engine or any portion thereof, an individual or plurality of transistor gates, a buffer or any other device designed to assist any logical operation As illustrated, the functional block 104 receives a test pattern of data 106 and a power supply voltage (V_dd) 108. Based on at least the test pattern of data 106 and the power supply voltage 108, functional block 104 produces a generated functional block test signal 110. As used herein, the power supply voltage 108 may be a voltage source used to supply power for the functioning of the components to which the power supply voltage is coupled.

The test pattern of data 106 may be any signal, analog or digital, representing information provided as an input to at least a portion of the component or components that comprise the functional block 104. The test pattern of data 106 may represent any information sufficient to drive the functional block 104 including actual operational data for use during normal operation of the functional block 104. For instance, in the embodiment where the functional block 104 represents a portion of a graphics pipeline, the test pattern of data may be image data operated on by the functional block 104 during normal rendering operations. The test pattern of data 104 may be stored in a register (not illustrated) located on or off the system 100 or, alternatively, may be supplied to the functional block 104 from any component, functional block pipeline or device located on or off the system 100. For instance, the test pattern of data 104 may be supplied to the functional block from a test probe utilized during chip testing (e.g., binning and wafer sort processes). In operation, the functional block 104 produces a generated functional block test signal 110, analog or digital, representing a performance characteristic, such as but not limited to operational speed, of at least a portion of the functional block 104 as driven by the test pattern of data 106 when operating with power supply voltage 108. In one embodiment, this may correspond to the rate or frequency at which a particular function is performed. For example, if the functional block 104 represents a portion of a graphics pipeline, the generated functional block test signal 110 may represent the frequency by which image data is stored in a frame buffer.

The adaptive power supply circuit 102 includes a target signal generating circuit 112, a signal comparator circuit 116 and a supply voltage adjustment circuit 120. As illustrated, the target signal generating circuit 112 receives the power supply voltage 108 and generates a target signal 114 based thereon. The target signal 114 may be any signal, analog or digital, representing a predetermined ideal or approximated ideal generated functional block test signal 110. In other words, if the generated functional block test signal 110 represents the rate by which image data is stored in a frame buffer, the target signal 114 may be a similar signal representing a predetermined ideal or approximated ideal rate.

The signal comparator circuit 116 receives the generated functional block test signal 110 and the target signal 114 and generates a signal 118 representing at least one the difference between the signals 110, 114. In one embodiment, the signal comparator circuit 116 may compare the phase difference between the two signals 110, 114. In another embodiment, the signal comparator circuit 116 may compare the amplitudes, frequencies or any other characteristic of the two signals 110, 114. Signal 118 may be any appropriate signal, analog or digital, capable of indicating an observed difference, as seen by the signal comparator circuit 116, between the generated functional block test signal 110 and the target signal 114.

The supply voltage adjustment circuit 120 receives the signal 118 and generates the power supply voltage 108 based thereon. In this manner, the power supply voltage 108 is updated to reduce the difference between the generated functional block test signal 110 and the target signal 114 as seen by the signal comparator circuit 116. As indicated above, the power supply voltage 108 may be provided to at least one of the functional block 104 and the target signal generating circuit 112. In this manner, the same or similar test pattern of data 106 may be provided to the functional block 104 as described above to generate a new generated functional block test signal 110 for subsequent comparison to the target frequency 114.

As explained above and illustrated in FIG. 1, the adaptive power supply circuit 102, when connected to a functional block 104, may be described as having two loops: Loop 1 and Loop 2. Loop 1 is a closed loop within the adaptive power supply circuit 102 defined by the path connecting the signal comparator circuit 116, the supply voltage adjustment circuit 120 and the target signal generating circuit 112. Loop 2 is a closed loop when the adaptive power supply circuit 102 is connected to a functional block 104 and is defined by the path connecting the signal comparator circuit 116, the supply voltage adjustment circuit 120 and the functional block 104. In operation, Loop 1 generates and updates the power supply voltage 108 and the target signal 114. On the other hand, Loop 2 generates the generated functional block test signal 110 and supplies the resulting power supply voltage 108 to the functional block 104.

In one embodiment, the adaptive power supply circuit 102 is activated only at boot-up or power-on of the system. In this manner, the adaptive power supply circuit 102 may continuously generate generated functional block test signals 110 and adjust the power supply voltage 108 for at least the functional block 104 until the generated functional block test signal 110 and the target signal 114 are substantially equal. At this point, the power supply voltage 108 is locked by the adaptive power supply circuit 102 for subsequent use by at least the functional block 104 or other components (not shown) of system 100. As utilized herein, locking the power supply voltage 108 is accomplished naturally by the feedback loops (Loop 1 and Loop 2) of system 100 when the difference between a characteristic of the target signal 114 and the generated functional block test signal 110 is substantially negligible as determined by, among other things, the tolerance of the signal comparator circuit 116. That is, the signal comparator circuit 116 will continually operate during operation of the circuit 100. Upon determination that a characteristic of the target signal 114 and the generated functional block test signal 110 are substantially equal, output signal 118 will serve to maintain the same or substantially similar power supply voltage 108.

Figure 2:
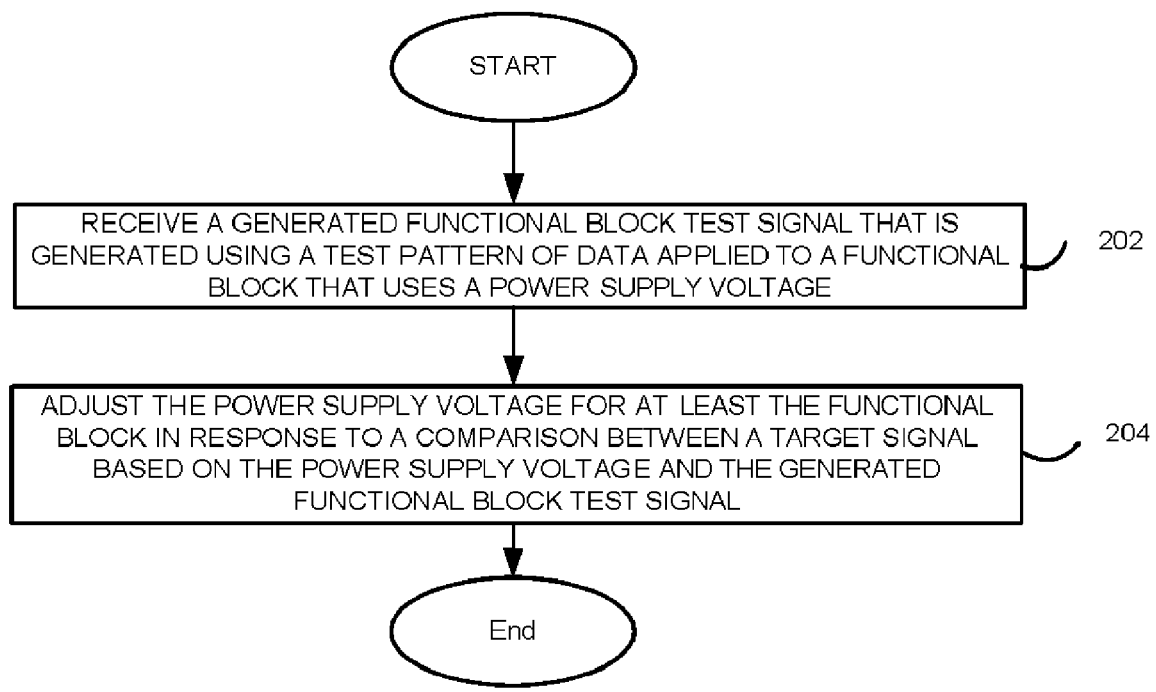
FIG. 2 is a flow chart illustrating one example of a method for generating an adaptive power supply voltage.

FIG. 2 is a flowchart 200 illustrating an example of one method for generating a power supply voltage. As illustrated, the method begins at block 202 where a generated functional block test signal, generated using a test pattern of data applied to a functional block that uses a power supply voltage, is received. For illustrative purposes, this portion of the method may be performed, for example, using the functional block 104 as shown in FIG. 1. Accordingly, when provided with the test pattern of data 106 and supplied with the power supply voltage 108, the functional block 104 produces a generated functional block test signal 110 representing a performance characteristic of at least a portion of the functional block 104 as driven by the test pattern of data 106 and operating with a power supply voltage 108.

After receipt, the method concludes at block 204 where the power supply voltage for the functional block is adjusted in response to a comparison between the target signal and the generated functional block test signal. Returning to FIG. 1, the signal comparator circuit 116 and the supply voltage adjustment circuit 120 provide one example of implementing this function. As previously indicated, the signal comparator circuit 116 may compare one or more characteristics such as, but not limited to, the amplitude and frequency of signals 110, 114, thereby providing to the supply voltage adjustment circuit a signal 118 representing the difference between the signals 110, 114. Based on the signal 118, the supply voltage adjustment circuit 120 generates an updated version of the power supply voltage 108.

By comparing the generated functional block test signal 110 and the target signal 114, the adaptive power supply circuit 102 adaptively adjusts the power supply voltage 108 as supplied to at least functional block 104 of system 100. As will be recognized the power supply voltage 108 may be supplied to any number of other components, functional blocks or pipelines as is necessary or desired. Because the power supply voltage 108 is adapted to at least the operational characteristics of the functional block 104, the power supply voltage 108 is optimized for at least functional block 104 and thereby provides minimal active and standby power dissipation in system 100.

Figure 3:
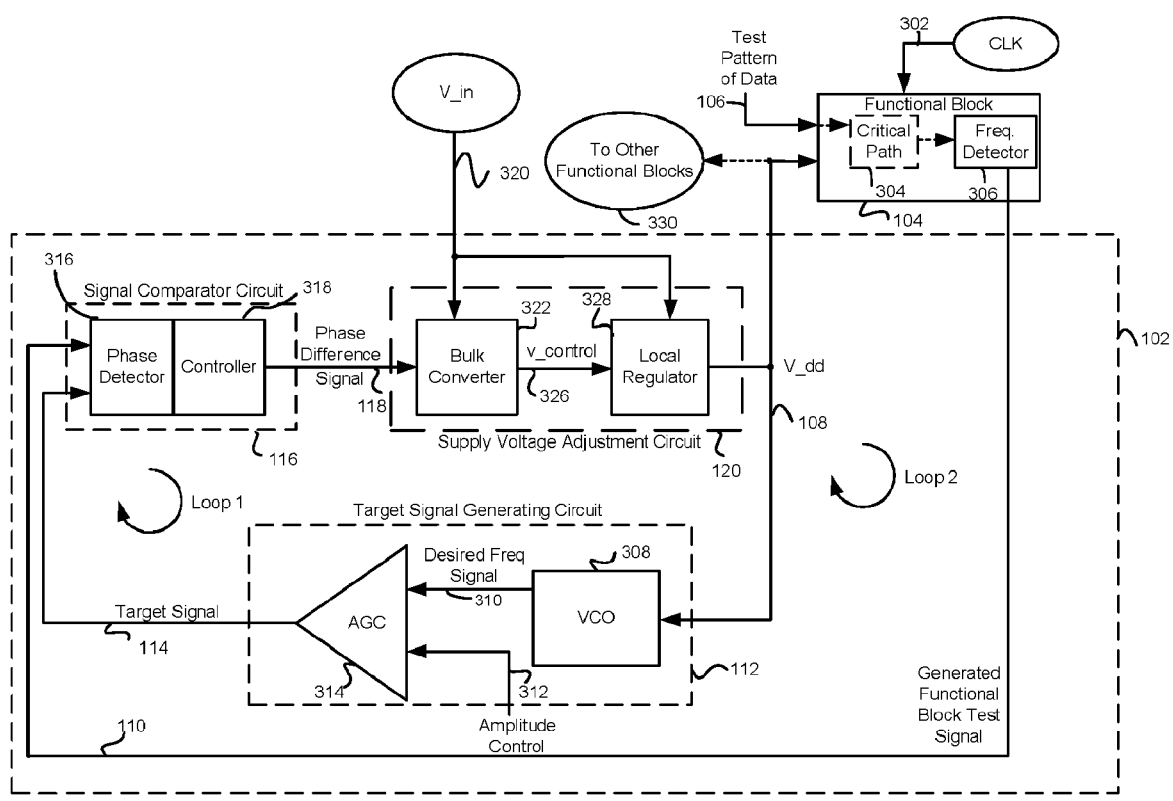
FIG. 3 is a detailed block diagram illustrating another example of a system including an adaptive power supply circuit coupled to at least one functional block in accordance with a second embodiment of the present disclosure.

FIG. 3 illustrates another example of at least a portion of a system 300 including at least one IC where at least a portion of the system 300 includes an adaptive power supply circuit 102 coupled to at least one functional block 104 in accordance with a second embodiment of the present invention. Similar to FIG. 1, the adaptive power supply circuit 102 includes a target signal generating circuit 112, a signal comparator circuit 116 and a supply voltage adjustment circuit 120. As illustrated in FIG. 3, the functional block 104 receives a clock signal 302 from an external clock source such as a phase locked loop or other source not supplied by the power supply voltage. The functional block 104 is further receptive to the power supply voltage 108 and test pattern of data 106 as described above with respect to FIG. 1.

In one embodiment, the functional block 104 may include at least one of a critical path 304 and a frequency detector 306. A critical path 304 may be a predetermined electronic pathway previously identified as having an impact on the performance of the functional block 104 or the system 300. It should be understood that a critical path 304 may be determined by simulating the operation of the components comprising the functional block 104 and analyzing a timing report to identify one or more critical timing paths that greatly impact the performance of the functional block 104 and thus the system 300. However, it is contemplated that the critical path 304 may comprise any identified path of the functional block 104 that has been pre-determined to adversely effect the performance of the functional block 104 or the system 300. It is recognized that the critical path 304 may include any number of individual components or devices that comprise the functional block 104. With respect to the example provided in FIG. 1 where the functional block 104 was a portion of a graphics pipeline, the critical path 304 may include the portion of the graphics pipeline, such as a first in first out buffer (FIFO), that most greatly affects the rate at which rendered images are stored in a frame buffer.

A frequency detector 306 may be connected to the output of the critical path 304 or to any other component or device in the functional block 104 such that the speed by which the functional block 104, as impacted most by the critical path 104, performs a particular function can be captured and represented as the generated functional block test signal 110. Returning to the example described above where the functional block 104 is a portion of a graphics pipeline and the critical path 304 is that portion of the graphics pipeline that most greatly has an effect on the rate at which rendered images are stored in the frame buffer, the frequency detector 306 might be placed between the FIFO buffer and the frame buffer to capture the frequency at which images are stored in the frame buffer. As described above with respect to FIG. 1, the generated functional block test signal 110 is supplied to the signal comparator circuit 116.

The target signal generating circuit 112 receives the power supply voltage 108 as input and is operative to generate the target signal 114 which represents, in one embodiment, the desired frequency by which the functional block 104 performs a function when provided with clock signal 302. As illustrated in FIG. 3, the target signal generator 112 includes a voltage controlled oscillator ("VCO") 308 and an automatic gain control ("AGC") amplifier 314 or other similar amplifier. In one embodiment, the VCO 308 is made of a plurality of electronic devices correspondingly constructed of the same process technology with corresponding manufacturing variations as the electronic devices comprising the functional block 104. Additionally, the VCO 308 is correspondingly constructed of a plurality of electronic devices based on at least one of the voltage and temperature tracking characteristics of the electronic devices comprising the functional block 104. Accordingly, the VCO 308 is designed to produce a desired frequency signal 310 representing the operational frequency by which the functional block 104 should be performing a specific function when supplied with clock signal 302. In other words, the VCO 308 is designed to replicate for instance, the known delay characteristics of the functional block 104 or its critical path.

The amplitude control 312 is any data or information representing the amount by which the amplitude of the desired frequency signal 310 should be adjusted to match or approximately match the amplitude of the generated functional block test signal 110 such that the signal comparator circuit 116 can accurately compare the two signals 110, 114. In one embodiment, the amplitude control 312 is generated by a driver or any application (including a BIOS) executing on a central processing unit (not shown) or any other suitable logic including ASICs, state machines, or discrete logic. As contemplated, the driver, application or dedicated logic may set the amplitude control 312 at a particular level based on the design parameters and characteristics of at least one of the known test pattern of data 106, the clock 302 and functional block 104. The amplitude control 312 may be stored in a register or other memory location (not shown) located on or off the system 300. In this example, the register may be coupled to the an input (e.g., one or more pins or ports) of the AGC amplifier 314 such that the information contained within the register is used to set the amplitude of the target signal 114.

Accordingly, the AGC amplifier 314 adjusts the amplitude of the desired frequency signal 310 by an amount indicated by amplitude control 312. In so doing, the AGC amplifier 314 avoids any unnecessary voltage adjustments due to improper signal amplitudes. The resulting output is target signal 114 having an amplitude similar to that of the generated functional block test signal 110.

Signal comparator circuit 116, in one embodiment, includes a phase detector 316 and which operates to receive and detect the phases of the generated functional block test signal 110 and the target signal 114. The output of the phase detector 316 is coupled to a controller 318 which generates a phase difference signal 118 representing the phase difference between the input signals 110, 114. In one embodiment, the controller 318 utilizes a pulse width modulation scheme to produce the phase difference signal 118 from the phase detector output 316. However, it is contemplated that any sufficient modulation scheme may be used to represent the phase difference between the input signals 110, 114.

The supply voltage adjustment circuit 120 receives the external power supply voltage (V_in) 320 and the phase difference signal 118 and generates the adaptive power supply voltage 108. In one embodiment, the supply voltage adjustment circuit 120 includes a bulk converter 322 and a local regulator 328. The bulk converter 322, which may be a conventional bulk converter as is understood in the art, operates to convert the phase difference signal 118 into a control voltage (v_control) 326 where the voltage level of the control voltage 326 will serve to adjust the power supply voltage 108. In one embodiment the bulk converter 332 generates the control voltage 326 based on the extracted DC component of the pulse-width modulated phase difference signal 118. When the phase of the generated functional block test signal 110 is lagging behind the target signal 114, the control voltage 326 is adjusted such that the resulting adaptive power supply voltage 108 is increased. Conversely, if the phase of the generated functional block test signal 110 is ahead of the target signal 114, the control voltage 326 is adjusted such that the resulting adaptive power supply voltage 108 is reduced. Local regulator 328 receives the control voltage 326 and the external voltage supply 320 and generates therefrom the power supply voltage 108. As illustrated, the power supply voltage 108 is supplied to the target signal generating circuit 112, the functional block 104 and other functional blocks 330, if any. Preferably the local regulator 328 provides adequate voltage granularity to appropriately adjust the generated functional block test signal 114. In one embodiment, the local regulator 328 is a gain controlled feedback amplifier having a second order temperature compensated band gap reference capable of providing 40 dB gain and 30 parts per million (ppm) voltage granularity.

Figure 4:
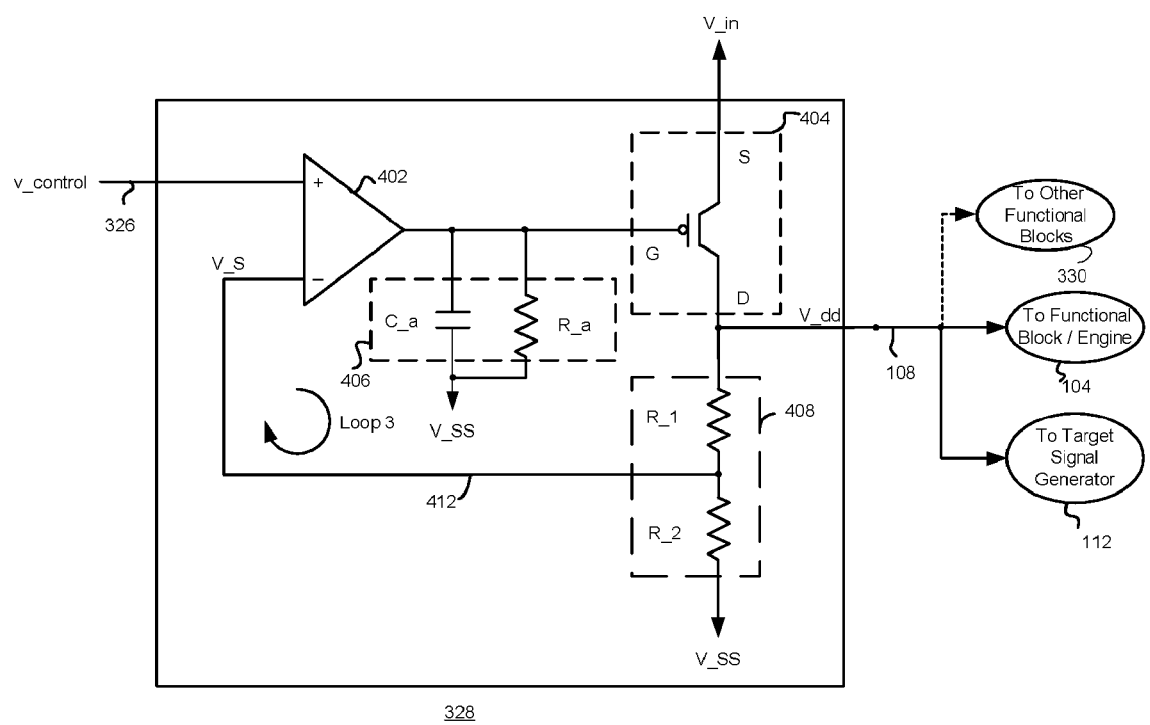
FIG. 4 is a schematic of an internal regulator as illustrated in the adaptive power supply circuit of FIG. 3.

FIG. 4 illustrates the local regulator 328 configured as a gain controlled feedback amplifier. As illustrated, the local regulator 328 receives the external power supply voltage 320 and control voltage 326 and generates therefrom an adaptive power supply voltage 108. The bulk converter 328 includes an operational amplifier 402, transistor 404, an RC circuit 406 and a voltage divider circuit 408. Although transistor 404 is illustrated as a PMOS transistor, it is contemplated that any suitable transistor technology may be utilized to achieve similar results based on the design of the system 100. Gate G of transistor 404 is coupled to the output of operational amplifier 402, Source S of transistor 404 is coupled to the external power supply voltage 320 and drain D is coupled to the voltage divider circuit 408. The RC circuit 406 is positioned between the gate G of the transistor 404 and ground (V_SS) to achieve stability of the feedback loop Loop 3. In operation, the operational amplifier 402 acts as a comparator, which takes the feedback voltage (V_S) 412 (a scaled-down version of the adaptive power supply voltage 108), compares it against the control voltage 326, and adjusts voltage supplied to the gate G of transistor 404 until the feedback voltage (V_S) 412 is substantially equal to the control voltage 326. The voltage divider circuit 408 is positioned between the drain D of the transistor 404 and ground (V_SS) to provide suitable feedback to the operational amplifier 402 (i.e., to provide feedback voltage (V_S) 412). As appreciated by one of ordinary skill in the art, feedback loop Loop 3 ensures that the power supply voltage 108 (tapped from drain D of transistor 404) has the correct nominal value regardless of variations.

Figure 5:
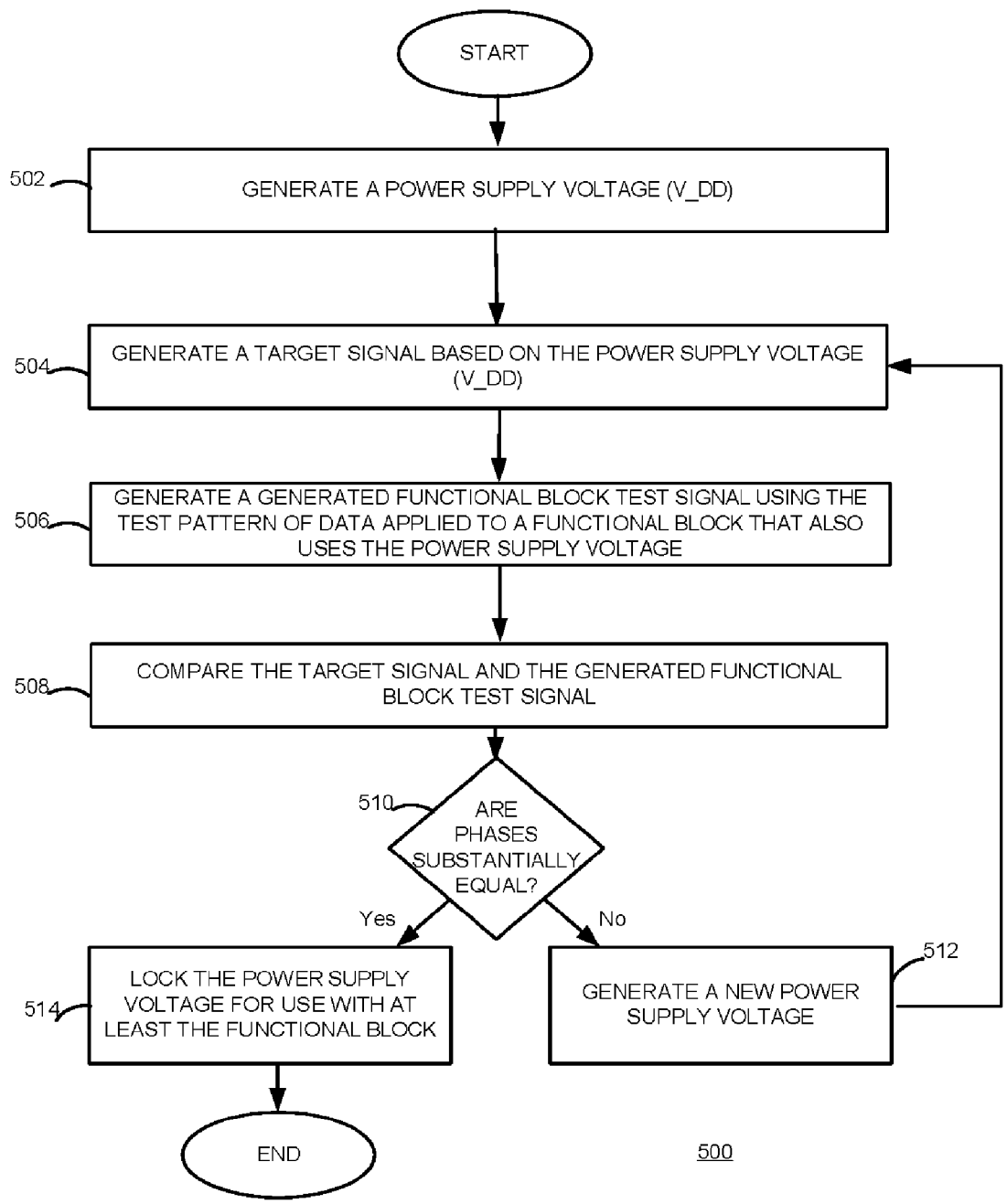
FIG. 5 is another flow chart illustrating another example of a method for generating an adaptive power supply voltage.

FIG. 5 illustrates a flowchart of another method of generating a power supply voltage. The method begins at block 502 where a power supply voltage is generated. For purposes of illustration, a power supply voltage 108 may be generated using the bulk converter 322 and the local regulator 328 as described above with reference to FIGS. 4 and 5. The method continues at block 504 where a target signal is generated based on the power supply voltage. Using system 300 provided in FIG. 3, this may be performed using the VCO 308 and the AGC amplifier 314 of the target signal generating circuit 112. At block 506 the process continues where a generated functional block test signal is generated using a test pattern of data applied to a functional block that also uses the power supply voltage. Returning to FIG. 4 for example, the generated functional block test signal 110 may be the result of providing a test pattern of data 106 to any portion of the functional block 104 and measuring the frequency or speed by which a particular function of the functional block 104 is performed. In one instance, this corresponds to using a frequency detector 306 to measure the frequency by which a function is performed by or most greatly affected by a predetermined critical path 304 of the functional block 104 when operating with power supply voltage 108 and clock 302.

After the signals are generated in blocks 504 and 506, the phases of the generated functional block signal and the target signal are compared in block 508. If the phases are substantially equal as determined in block 510, the power supply voltage is locked for subsequent use by at least the functional block as indicated in block 514. Alternatively, if the phases are not substantially equal as determined in block 510, a new power supply voltage is generated in block 512 and the method repeats itself beginning with block 504 until the phases, as determined in block 510, are substantially equal. The portions of the method identified in blocks 508-514 may be performed, in one embodiment, by the phase detector 316, the controller 116, bulk converter 322 and local regulator 328 as illustrated in FIGS. 3 and 4 and as described above. By utilizing the apparatus described in FIGS. 3 and 4 and the method illustrated in FIG. 5, optimal power supply voltages may be selected for at least the functional block 104 when operating with clock 302. By identifying a critical path 304 or any portion of a functional block 104 as having an effect on the performance of system 300, an optimized or adaptive power supply voltage 108 can be obtained by repeatedly comparing the generated functional block test signal 110 and the target signal 114. The power supply voltage 108 is locked after optimization and subsequently supplied to any number of system components. Because the power supply voltage 108 is optimized, active and standby power dissipation is reduced in system 300. Consequently, battery life in mobile devices is prolonged and usage time is increased.

It is also contemplated that the adaptive power supply circuit 102 as described in FIGS. 1 and 3 may also be utilized during the wafer sort process to monitor a power supply voltage 108 as applied to one or more functional blocks 104 on a selected IC located on a wafer. In this environment, the test pattern of data 106 may be supplied to a functional block 104 from an external source such as a test probe. Accordingly, by monitoring the target signal 114, the generated functional block test signal 110 and the adaptive power supply voltage 108, the process status of the selected IC and thus the entire wafer can be determined for binning purposes.

Figure 6:
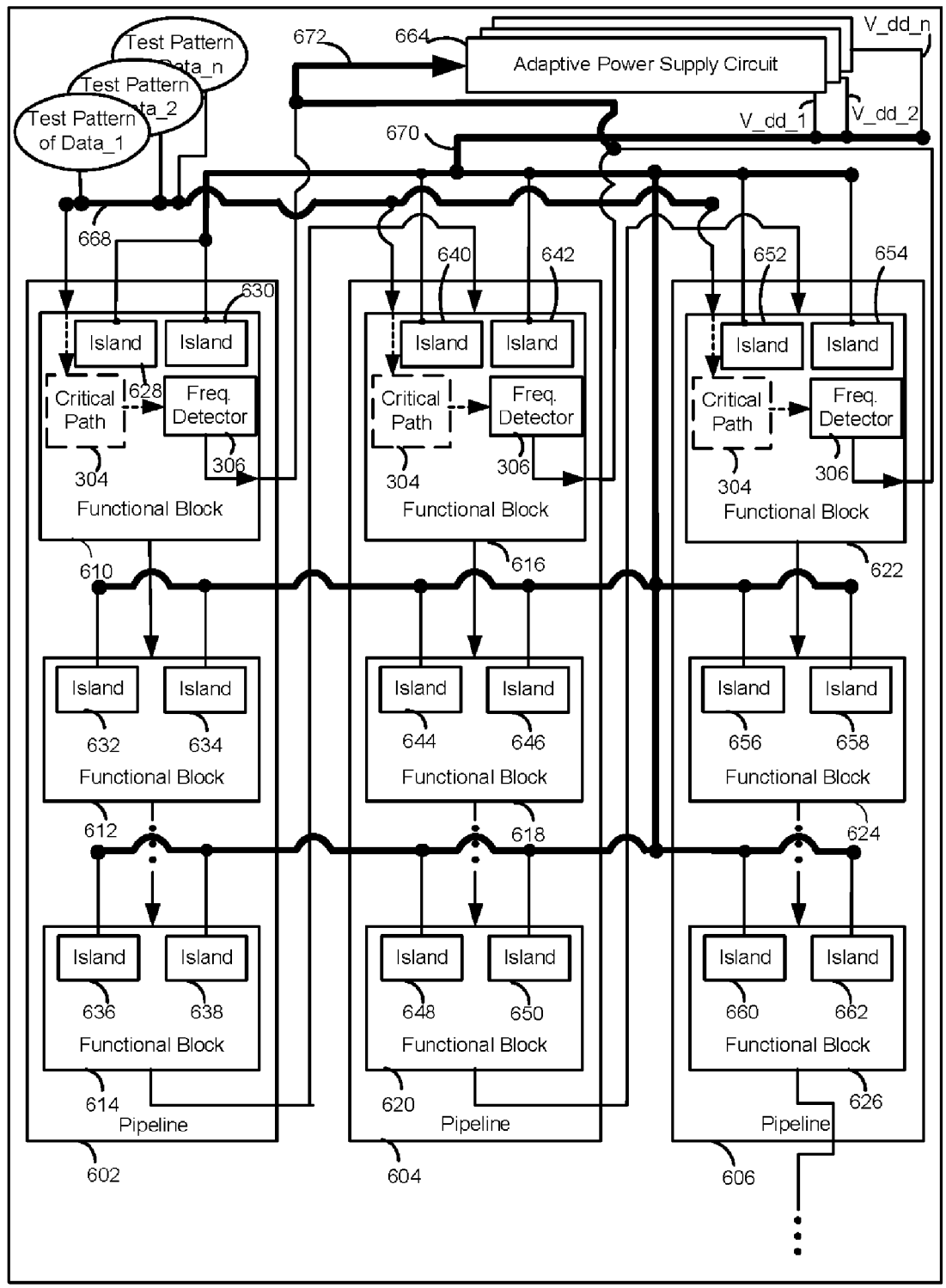
FIG. 6 is a block diagram illustrating a system on a chip having at least one adaptive power supply voltage circuit and at least one functional block.

FIG. 6 illustrates a system on a chip ("SOC") 600 having a plurality of pipelines 602-608. Each pipeline 602-608 includes at least one functional block 610-626 similar to the functional block 104 in FIGS. 1 and 3. At least one of the functional blocks 610-626 that comprise the pipelines 602-606 contain at least one voltage island 628-662 that is operative to provide power to at least a portion of each of the functional blocks 610-662. At least one of the functional blocks 610-626 contain at least one critical path 304 and at least one frequency detector 306 as described with reference to FIG. 3. For purposes of example, functional blocks 610, 616, 622 each contain a critical path 304 and a frequency detector 306 while each of the functional blocks 610-626 contain at least one voltage island 628-662. However, one of ordinary skill in the art will appreciate that any number of the functional blocks 610-626 may contain any number of critical paths and frequency detectors and voltage islands.

The SOC 600 also includes at least one adaptive power supply circuit 664 similar to the adaptive power supply circuit 102 of FIGS. 1 and 3. Each of at least one adaptive power supply circuits 664 generates a different power supply voltage V_dd_1, V_dd_2, . . . V_dd_n (collectively, the at least one power supply voltages) where n represents the number of adaptive power supply circuits 664 necessary to provide different power supply voltages to the functional blocks 610-626. It is recognized that there might be as few as one adaptive power supply circuit 664 (and therefore one power supply voltage used to support all of the functional blocks 610-626 or as many adaptive power supply circuits 664 and corresponding power supply voltages as there are functional blocks 610-626. For purposes of illustration, the power supply voltages V_dd_1, V_dd_2, . . . V_dd_n are shown as carried over a bus 670 such that any voltage island 628-662 is designed to tap the corresponding correct power supply voltage from bus 670.

The SOC 600 also includes at least one test pattern of data as supplied to bus 668 where each test pattern of data may correspond to an adaptive power supply circuit 664. By designing the SOC 600 with multiple critical paths 304, frequency detectors 306 and adaptive power supply circuits 604, the SOC 600 may contain multiple power supply voltages set at different levels and supplied to various voltage islands 628-662. Finally, the output of each frequency detector 306 is tied to bus 672 during operation of the at least one adaptive power supply circuit 664 in accordance with the methods described above.

In operation, the at least one test pattern of data carried on bus 668 are supplied to at least one functional block 610-626. The output of the frequency detectors 306 are supplied along bus 670 to the at least one adaptive power supply circuits 664 and the at least one power supply voltages are supplied along bus 670 to corresponding voltages islands 628-662. In operation, the at least one adaptive power supply circuits 664, the at least one test patterns of data and functional blocks 610-626 operate in the same manner as described above with respect to FIGS. 1 and 3 to provide the necessary adaptive power supply voltage or voltages to the functional blocks 610-626 contained on the SOC 600. It is contemplated that each voltage island 628-662 receives a power supply voltage that is optimized for power dissipation such that the overall SOC 600 can operate using minimal power. Further power savings may be realized by selectively shutting down select voltage islands 628-662 when not needed during normal operation.

The above detailed description of the invention and the examples described therein have been presented for the purposes of illustration and description only and not by limitation. For example, systems 100 and 300 disclosed in FIGS. 1 and 3 are depicted having only one functional block 104. However, it is contemplated that multiple functional blocks may be part of either system and receive the power supply voltage 108. It is therefore contemplated the present invention cover any and all modifications, variations, or equivalents that fall in the spirit and scope of the basic underlying principles disclosed above and claimed herein.

What is claimed is:

1. An integrated circuit comprising:
a signal comparator circuit operative to compare a target signal based on a power supply voltage with a generated functional block test signal that is based on a test pattern of data applied to a functional block that also receives the power supply voltage; and
a supply voltage adjustment circuit operatively coupled to the signal comparator circuit, and operative to adjust the power supply voltage for at least the functional block in response to the comparison between the target signal and the generated functional block test signal.

2. The integrated circuit of claim 1 further comprising a target signal generating circuit operative to generate the target signal based on the power supply voltage wherein the target signal generating circuit comprises a voltage controlled oscillator correspondingly constructed of a plurality of electronic devices based on at least one of the voltage and temperature tracking characteristics of the electronic devices comprising the functional block.

3. The integrated circuit of claim 2, wherein:
the voltage controlled oscillator is operative to generate a desired frequency signal in response to the power supply voltage; and
the target signal circuit further comprises an amplifier operative to generate the target signal based on the desired frequency signal.

4. The integrated circuit of claim 1, wherein the signal comparator circuit comprises:
a phase detector operative to detect the phase of the target signal and the phase of the generated functional block test signal; and
a controller operative to generate a phase difference signal based on the detected phases of the target signal and the generated functional block test signal, where the phase difference signal is representative of the comparison between the target signal and the generated functional block test signal.

5. The integrated circuit of claim 1, wherein the supply voltage adjustment circuit comprises a local regulator operative to generate the power supply voltage based on the comparison between the target signal and the generated functional block test signal.

6. The integrated circuit of claim 1, wherein the supply voltage adjustment circuit comprises:
- a bulk converter operative to generate a control voltage in response to the difference between the target signal and the generated functional block test signal; and
- a local regulator operative to generate the power supply voltage based on at least one of the control voltage and an external power supply voltage.

7. A method comprising:
- receiving a generated functional block test signal that is generated using a test pattern of data applied to a functional block that uses a power supply voltage; and
- adjusting the power supply voltage for at least the functional block in response to a comparison between a target signal based on the power supply voltage and the generated functional block test signal.

8. The method of claim 7 wherein adjusting the power supply voltage comprises adjusting the power supply voltage until the phases of the target signal and the generated functional block test signal are substantially equal.

9. The method of claim 7 comprising generating the generated functional block test signal in response to receiving the test pattern of data.

10. The method of claim 7 wherein at least the receiving of the generated functional block test signal and adjusting the power supply voltage for at least the functional block is performed in response to a power-on condition.

11. An integrated circuit comprising:
- an adaptive power supply circuit operative to generate an adaptive power supply voltage, comprising:
  - a bulk converter operative to generate a control voltage based on at least one of an external power supply voltage and a phase difference signal;
  - a local regulator operative to generate the adaptive power supply voltage based on at least one of the control voltage and the external power supply voltage; and
  - a signal comparator circuit operative to generate the phase difference signal by comparing the phase of a target signal based on the adaptive power supply voltage with the phase of a received generated functional block test signal based on a test pattern of data.

12. The integrated circuit of claim 11 further comprising a target signal generating circuit operative to generate the target signal based on the adaptive power supply voltage, wherein the target signal generating circuit comprises:
- a voltage controlled oscillator operative to generate a desired frequency signal in response to the adaptive power supply voltage and wherein the voltage controlled oscillator is correspondingly constructed of a plurality of electronic devices based on at least one of the voltage and temperature tracking characteristics of the electronic devices comprising the functional block; and
- an automatic gain control amplifier operative to generate the target frequency signal based on at least one of the desired frequency signal and an amplitude control.

13. The integrated circuit of claim 11, wherein the signal comparator circuit further comprises:
- a phase detector operative to detect the phase of the target signal and the frequency of the generated phase block test signal; and
- a controller operative to generate the phase difference signal based on the detected phases of the target signal and the generated functional block test signal.

14. The integrated circuit of claim 13, wherein the controller is operative to generate the phase difference signal using a pulse-width modulation scheme.

15. The integrated circuit of claim 11, wherein the local regulator comprises a gain controlled feedback amplifier.

16. An integrated circuit comprising:
- a plurality of functional blocks each having at least one supply voltage island; and
- at least one adaptable power supply circuit, each of the at least one adaptable power supply circuits comprising:
  - a signal comparator circuit operative to compare a target signal based on a power supply voltage with a generated functional block test signal that is based on a test pattern of data applied to one of the plurality of functional blocks that also receives the power supply voltage; and
  - a supply voltage adjustment circuit operatively coupled to the signal comparator circuit, and operative to adjust the power supply voltage for the at least one supply voltage island of the plurality of functional blocks in response to a comparison between the target signal and the generated functional block test signal.

17. The integrated circuit of claim 16, wherein at least one of the plurality of functional blocks includes a frequency detector operative to generate the generated functional block test signal.

18. The integrated circuit of claim 16 further comprising a target signal generating circuit operating to generate the target signal based on the power supply voltage, wherein the target signal generating circuit comprises:
- a voltage controlled oscillator operative to generate a desired frequency signal in response to the power supply voltage; and
- an amplifier operative to generate the target signal based on at least one of the desired frequency signal and an amplitude control.

19. The integrated circuit of claim 16, wherein the signal comparator circuit comprises:
- a phase detector operative to detect the phase of the target signal and the phase of the generated functional block test signal; and
- a controller operative to generate a phase difference signal based on the detected phases of the target signal and the generated functional block test signal, where the phase difference signal is representative of the comparison between the target signal and the generated functional block test signal.

20. The integrated circuit of claim 16, wherein the supply voltage adjustment circuit comprises a local regulator operative to generate the power supply voltage based on the comparison between the target signal and the generated functional block test signal.

* * * * *